(12) United States Patent
Rezeq et al.

(10) Patent No.: US 7,405,685 B2
(45) Date of Patent: Jul. 29, 2008

(54) NEGATIVE CONTRIBUTIVE OFFSET COMPENSATION IN A TRANSMIT BUFFER UTILIZING INVERSE CLOCKING

(75) Inventors: Sameh S. Rezeq, Dallas, TX (US); Dirk Leipold, Dallas, TX (US); Robert B. Staszewski, Garland, TX (US); Chih-Ming Hung, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/178,993

(22) Filed: Jul. 11, 2005

(65) Prior Publication Data

US 2007/0008199 A1     Jan. 11, 2007

(51) Int. Cl.
*H03M 3/00* (2006.01)

(52) U.S. Cl. ........................ 341/143; 341/118
(58) Field of Classification Search ................ 341/143, 341/155, 120, 118, 141
See application file for complete search history.

(56) References Cited

U.S. PATENT DOCUMENTS

| | | | | |
|---|---|---|---|---|
| 3,755,739 A | * | 8/1973 | Okano | 375/308 |
| 5,892,798 A | * | 4/1999 | Finkenbeiner et al. | 375/305 |
| 6,292,121 B1 | * | 9/2001 | Cake et al. | 341/143 |
| 6,396,428 B1 | * | 5/2002 | Cheng | 341/143 |
| 6,768,391 B1 | * | 7/2004 | Dent et al. | 332/185 |
| 2005/0156764 A1 | * | 7/2005 | Cosand | 341/133 |

* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

A novel method and apparatus for a negative contributive offset compensation mechanism for a transmit buffer adapted to compensate for the positive offset generated by higher order sigma-delta modulators used to amplitude modulate the transmit buffer. The positive outputs from the sigma-delta modulator are processed differently than the negative outputs. The inverters associated with the negative outputs in the sigma-delta modulator are removed and the clock signal used to drive the transistors corresponding to the negative outputs is negated or shifted 180 degrees from the clock used to drive the transistors corresponding to the positive outputs. A non-inverted version of the clock is used with the positive outputs and an inverse clock is used with the negative outputs. Use of the inverse clock causes a negative contributive offset to be generated that is added on the second half cycle of each clock. The result is an offset compensated RF output signal having zero offset.

35 Claims, 9 Drawing Sheets

NEGATIVE CONTRIBUTIVE OFFSET COMPENSATION IN A TRANSMIT BUFFER UTILIZING INVERSE CLOCKING

REFERENCE TO RELATED APPLICATIONS

The present invention is related to U.S. application Ser. No. 11/115,815, filed Apr. 26, 2005, entitled "Low Noise High Isolation Transmit Buffer Gain Control Mechanism", similarly assigned and incorporated herein by reference in its entirety.

FIELD OF THE INVENTION

The present invention relates to the field of data communications and more particularly relates to a method and apparatus for negative contributive offset compensation in a transmit buffer utilizing inverse clocking.

BACKGROUND OF THE INVENTION

It is well known in the communication arts that a transmit (TX) buffer is required for both wired and wireless communications systems to interface the transmit path signal to the outside environment. In many cases, the transmit buffer is required to apply a variable gain to the transmit signal in order to increase or reduce the amplitude of the output signal. One such case occurs when the transmitted signal is part of an amplitude modulated communication system and the transmit buffer itself is used to implement the amplitude modulation function. The signal to noise ratio (SNR) requirements of such TX buffers in most systems are extremely strict, meaning that any amplitude control circuitry should contribute no more than negligible noise to the buffer output. The carrier leakage or reverse isolation (which can also be considered gain accuracy at low gain levels) of such transmit buffers is also an important concern. In addition, the current consumption requirements for these transmit buffers is limited such that any gain control scheme cannot 'burn' or waste current in order to meet the power consumption budget and the strict signal to noise requirements stated above.

There exist in the prior art multiple transmit chain architectures for transforming a digitally encoded bit stream into an RF modulated waveform at a power level suitable for transmission. The transmit power level for a cellular transceiver integrated circuit (IC) is typically around 3 dBm for interfacing with external power amplifiers (PAs). This output power level, however, is not constant in amplitude-modulated standards, such as EDGE, and must be controlled with appropriate variable-gain circuitry. Typical prior art architectures, such as single-sideband upconversion, perform digital-to-analog conversion on-chip and employ a variable gain pre-power amplifier (PPA) to transmit the required signal at the desired power level. In these architectures, the overall power consumption of the transmit chain, including all the D/A converters and variable gain buffer components, is at least 50 mW which is a relatively high amount of power. It is desirable to be able to reduce the power consumption of the transmit chain significantly.

In amplitude modulated communication systems, sigma-delta modulators can be used to amplitude modulate a transmit buffer that functions to provide digital to RF amplitude conversion (DRAC). The sigma-delta modulator is used to increase the resolution of the DRAC. The sigma-delta modulator "amplitude modulates" a carrier frequency signal, i.e. a clock signal resembling the carrier and having a frequency that is reflected by the period of the clock. A problem arises, however, when higher orders of MASH-structure sigma-delta modulators are used. Higher orders of sigma-delta modulator used to amplitude modulate a transmit buffer generates a positive offset that is added to the output signal. The size of the offset is dependent on the order of modulator used. The positive offset causes the output spectrum of the RF output signal to be distorted thus reducing the performance of the system whereby the system may now be out of the specifications of the particular communications standard.

Prior art solutions to this offset problem utilize a digital approach whereby the offset was measured and subtracted from the output signal. In systems where sigma-delta outputs directly drive analog transistors at RF frequencies, negative numbers do not exist in that portion of the circuit, and thus this solution will not work.

There is thus a long felt need for an amplitude modulator that (1) is capable of performing modulations without any offsets generated by the sigma-delta modulator; (2) does not require explicit digital subtraction; (3) is able to operate at RF frequencies of at least 1 GHz.

SUMMARY OF THE INVENTION

The present invention provides a solution to the problems of the prior art by providing a method and apparatus for a negative contributive offset compensation mechanism for a transmit buffer. The offset compensation scheme is presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit.

The present invention is a negative contributive offset compensation mechanism that is adapted to compensate for the positive offset generated by higher order sigma-delta modulators used to amplitude modulate a transmit buffer. If not compensated for, this offset appears in the output spectrum and causes distortion.

A conventional higher order sigma-delta modulator is operative to generate both positive and negative outputs. Positive outputs are defined as outputs that normally do not pass through inverters. Negative outputs are defined as outputs that normally pass through inverters before being output from the sigma-delta modulator. The positive and negative outputs of the sigma-delta modulator are first gated and then used to directly drive the gates of analog MOS transistors at RF frequencies. The inputs to the transistors are normally driven by a clock input to the gates. The number of transistors being turned on during any one clock cycle determines the output amplitude at that moment, thus implementing amplitude modulation.

As discussed supra, performing digital subtraction on the output of the amplitude modulation is not practical, as negative numbers do not exist in this portion of the transmitter circuit. Rather, the present invention is operative to process the positive outputs from the sigma-delta modulator differently than the negative outputs. First, the inverters associated with the negative outputs are removed. Second the clock signal used to drive the transistors corresponding to the negative outputs is shifted 180 degrees from the clock used to drive the transistors corresponding to the positive outputs. Thus, a non-inverted version of the clock is used with the positive outputs and an inverse clock is used with the negative outputs. Use of the inverse clock causes a negative contributive offset to be generated that is added on the second half cycle of each clock. The result is an offset compensated RF output signal having zero offset.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of offset compensation in a digital to radio frequency (RF) amplitude converter (DRAC), the method comprising the steps of coupling a plurality of transistors to positive outputs and negative outputs generated by a sigma-delta modulator, first driving transistors coupled to the positive outputs using a clock signal, second driving transistors coupled to the negative outputs using an inverted clock signal and summing outputs of the plurality of transistors to yield an offset compensated output signal.

There is also provided in accordance with the present invention, a digital to radio frequency (RF) amplitude converter apparatus comprising a plurality of transistors coupled to positive outputs and negative outputs generated by a sigma-delta modulator, first means for driving transistors coupled to the positive outputs with a clock signal, second means for driving transistors coupled to the negative outputs with an inverted version of the clock signal and third means for summing the output of each transistor to yield an offset compensated output signal.

There is further provided in accordance with the present invention, a transmit buffer comprising a plurality of gates arranged in a parallel array, wherein a first portion of the gates are coupled to one or more positive outputs generated by a sigma-delta modulator, a second portion of the gates are coupled to one or more negative outputs generated by the a sigma-delta modulator, first means for driving the gates coupled to the positive outputs with a clock signal, second means for driving the gates coupled to the negative outputs with an inverted version of the clock signal, a plurality of transistors, the output of each gate coupled to one of the transistors and a matching network coupled to the output of each transistor and operative to generate an offset compensated radio frequency (RF) output signal.

There is also provided in accordance with the present invention, a digital to radio frequency (RF) amplitude converter apparatus comprising a plurality of switches coupled to positive outputs and negative outputs generated by a digital modulator, first means for driving a first portion of the switches coupled to the positive outputs with a clock signal, second means for driving a second portion of the switches coupled to the negative outputs with an inverted version of the clock signal and third means for summing the output of each switch to yield an output signal.

There is further provided in accordance with the present invention, a transmit buffer comprising a plurality of switches coupled to outputs generated by a digital modulator, first means for driving a first portion of the switches coupled to the outputs with a clock signal, second means for driving a second portion of the switches coupled to the outputs and third means for summing the output of each switch to yield an output signal.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| ACW | Amplitude Control Word |
| ADPLL | All Digital Phase Locked Loop |
| AM | Amplitude Modulation |

-continued

The following notation is used throughout this document.

| Term | Definition |
| --- | --- |
| ASIC | Application Specific Integrated Circuit |
| CDMA | Code Division Multiple Access |
| CKR | Retimed Reference Clock |
| CKV | Variable Oscillator Clock |
| CMOS | Complementary Metal Oxide Semiconductor |
| DAC | Digital to Analog Converter |
| DCO | Digitally Controlled Oscillator |
| DEM | Dynamic Element Matching |
| DRAC | Digital to RF Amplitude Converter |
| DRP | Digital RF Processor or Digital Radio Processor |
| DSP | Digital Signal Processor |
| EDGE | Enhanced Data rates for Global Evolution |
| FCW | Frequency Command Word |
| FPGA | Field Programmable Gate Array |
| FREF | Frequency Reference |
| GGE | GSM/GPRS/EDGE |
| GSM | Global System for Mobile Communications |
| HDL | Hardware Description Language |
| IC | Integrated Circuit |
| LO | Local Oscillator |
| MOS | Metal Oxide Semiconductor |
| NMOS | n-channel Metal Oxide Semiconductor |
| PA | Power Amplifier |
| PLL | Phase Locked Loop |
| PM | Phase Modulation |
| PPA | Pre-Power Amplifier |
| RF | Radio Frequency |
| SNR | Signal to Noise Ratio |
| WCDMA | Wideband Code Division Multiple Access |

DETAILED DESCRIPTION OF THE INVENTION

The present invention is a mechanism for negative contributive offset compensation for use in a transmit buffer of a digital radio processor (DRP). The invention is intended for use in a digital radio transmitter or transceiver but can be used in other applications as well, such as a general communication channel. The present invention provides a solution to the problems of the prior art by providing a method and apparatus for a digital to RF amplitude converter (DRAC) that is capable of compensating for negative offsets. The negative offsets are typically being generated from the use of a MASH-type sigma-delta modulator in the DRAC that functions to increase the effective resolution of the DRAC. The negative contributive offset compensation mechanism is presented in the context of an all digital direct digital-to-RF amplitude converter (DRAC), which efficiently combines the traditional transmit chain functions of upconversion, I and Q combining, digital to analog (DAC) conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for GSM/GPRS/EDGE (GGE). In one example embodiment, the circuit is constructed as an array of 64 unit-weighted transistor switches that are used to provide coarse 6-bit digital amplitude modulation. An additional array of 8 unit-weighted transistors is provided to perform high speed dithering in order to achieve fine amplitude resolution. In a GSM mode of operation, the PPA provides for precise ramp-up and ramp-down of transmit power.

It is appreciated by one skilled in the art that the negative contributive offset compensation mechanism, transmit buffer and DRAC of the present invention can be adapted to comply with numerous wireless communications standard such as GSM, extended data rate Bluetooth, WCDMA, etc. It is appreciated, however, that the invention is not limited for use with any particular communication standard (wireless or otherwise) and may be used in optical, wired and wireless applications. Further, the invention is not limited for use with a specific modulation scheme but is applicable to other amplitude modulation schemes as well.

The authors have constructed a DRAC incorporating the present invention in a single-chip GGE transceiver realized in a 90 nm digital CMOS process. The DRAC implements digital RF amplitude modulation for a wireless standard involving a non-constant amplitude modulation. In this example application, the DRAC functions as a pre-power amplifier for a low power all digital GGE based transmitter. The DRAC constructed has an efficiency of 17% at 0 dBm output power. Compared to the power efficiency of prior art schemes, this is a significant improvement in power efficiency. Further, the DRAC occupies only 0.005 $mm^2$, in comparison to well over 1 $mm^2$ for the prior art analog architectures implemented in CMOS. In addition, the static power consumption of the entire transmit chain or path is essentially zero due to its fully digital nature.

Note that throughout this document, the term transmit buffer is intended to include a transmit buffer as well as various amplifier circuits such as pre-power amplifier, low power amplifier, high power amplifier, etc. and it not intended to be limited by the amount of power produced.

Note also that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

Figure 1:
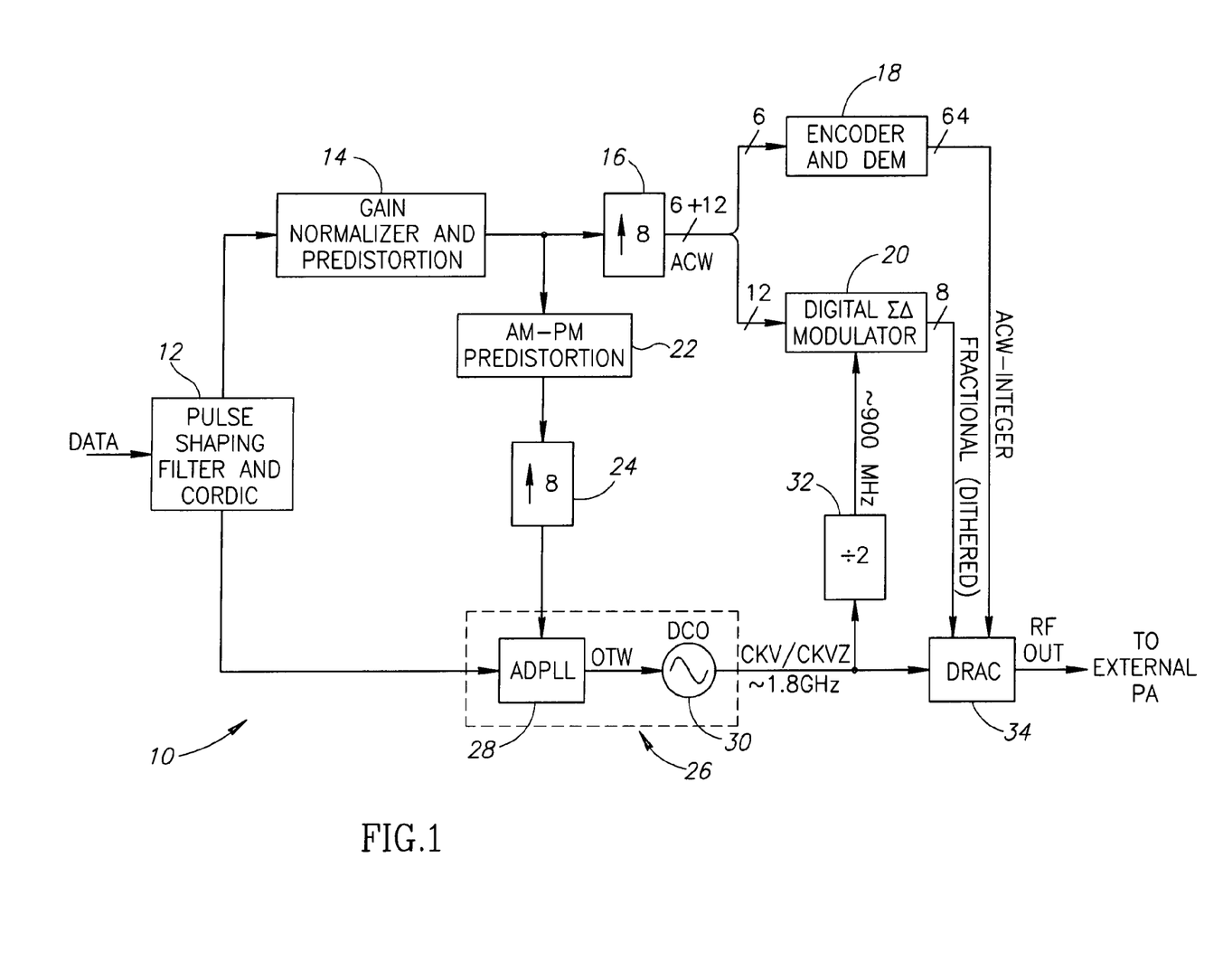
FIG. 1 is a block diagram illustrating an example embodiment of a polar transmitter and DRAC incorporating the negative contributive offset compensation mechanism of the present invention.

A block diagram illustrating an example embodiment of a polar transmitter and DRAC incorporating the negative contributive offset compensation mechanism of the present invention is shown in FIG. 1. The example application of the present invention, generally referenced 10, comprises a pulse shaping filter and cordic 12, gain normalizer and predistortion block 14, amplitude modulation/phase modulation (AM-PM) pre-distortion block 22, upsampling by eight 16, 24, all digital phase locked loop (ADPLL) 26 with digital logic portion 28, digitally controlled oscillator 30, encoder and dynamic element matching (DEM) block 18, digital sigma-delta modulator 20, divide by two 32 and digital to RF amplitude converter block 34. The negative contributive offset compensation scheme of the present invention is incorporated in the final and merging stages of the phase and amplitude modulation paths of the transmitter 10.

The fully digital polar transmitter architecture 10 for GGE comprises a pulse-shaping filter 12 which comprises separate I and Q filters followed by a cordic algorithm to convert the phase and amplitude outputs to the polar domain. In the example presented herein, the sampling rate is 3.25 MHz and is interpolated up to 26 MHz to further smoothen the modulating signals. The phase is differentiated to fit the frequency command word (FCW) format of the all digital PLL (AD-PLL) input, which has a wideband frequency modulation capability up to half the reference frequency (FREF) of 26 MHz. A key component of the ADPLL is a digitally controlled oscillator (DCO), whose core operates at twice the 1.6 to 2.0 GHz high band frequency or four times the 0.8-1.0 GHz low band.

The amplitude output of the gain normalizer and predistortion 14 is upsampled, via block 16. In block 14 the amplitude signal is multiplied by the step size of the digital-to-RF-amplitude converter (DRAC) and is then AM-AM predistorted. The amplitude control word (ACW) is then converted to the 64-bit unit weighted format of the DRAC. A dedicated bank of 8 DRAC transistors undergoes a 900 MHz third-order $\Sigma\Delta$ modulation (similar to that performed in the DCO) in order to enhance the amplitude resolution and to achieve noise spectral shaping. The DRAC controller 18 also performs dynamic element matching (DEM) (similar to that performed in the DCO) in order to enhance time-averaged linearity. Further, the DRAC implements the negative contributive offset compensation mechanism in accordance with the present invention. In the GSM mode of operation, a single Gaussian pulse shaping filter is used and the cordic circuit is bypassed. The AM path is temporarily engaged to ramp the output power to a desired level and remains fixed throughout the payload of the message.

Figure 2:
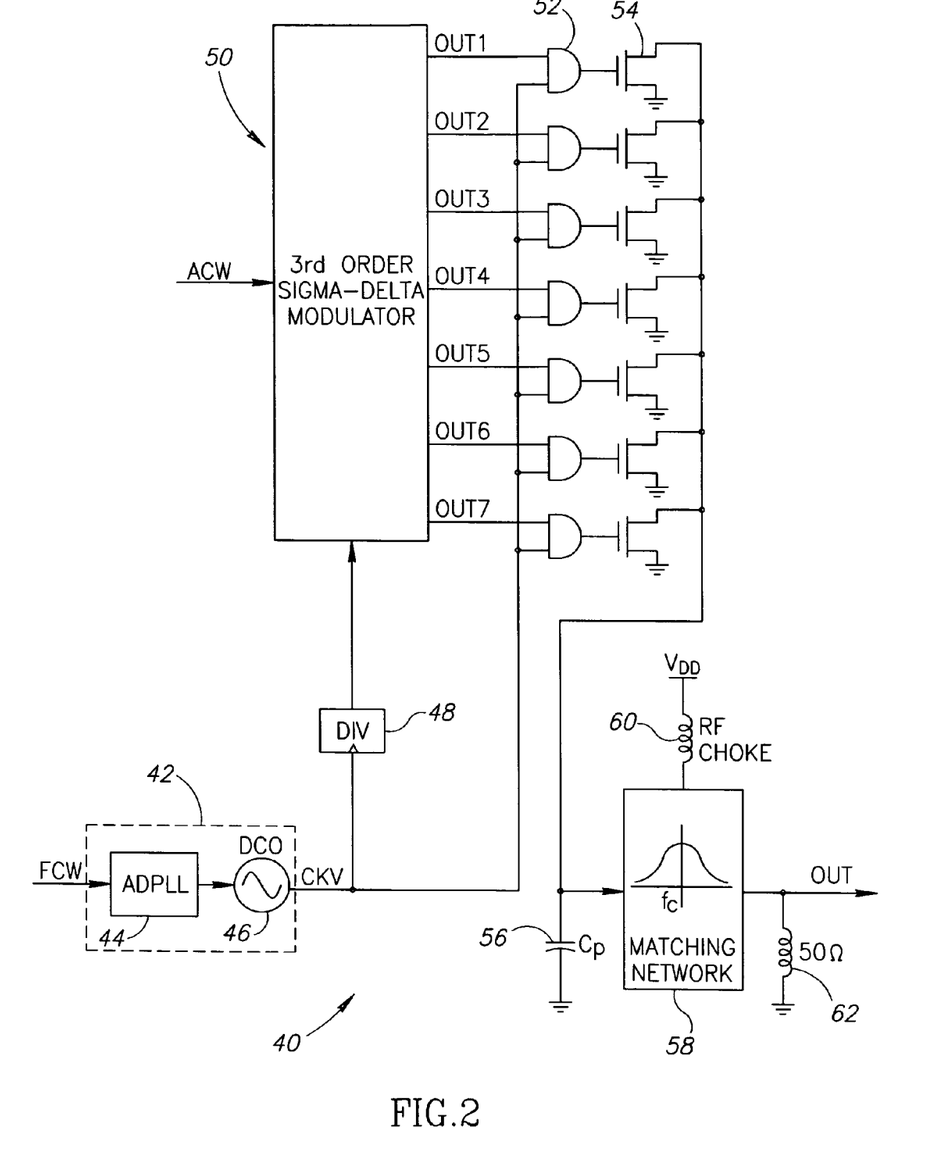
FIG. 2 is a circuit diagram illustrating an example digital to RF amplitude converter (DRAC) in more detail wherein only the non-inverted clock signal is used.

The example digital to RF amplitude converter (DRAC) used to illustrate the principles of the present invention will now be described in more detail. A circuit diagram illustrating an example digital to RF amplitude converter (DRAC) in more detail wherein only the non-inverted clock signal is used is shown in FIG. 2. The DRAC, generally referenced 40, comprises a plurality of N pass-gate type AND gates 52, a plurality of N output devices 54 (NMOS devices in this example), capacitor $C_P$ 56, matching network 58, RF choke 60 and output impedance 62. The DRAC operates as a pseudo class E type amplifier and is driven by a transmit chain signal comprising the square wave signal output of the DCO 46, output of divider 48 and an amplitude control word (ACW). Being a class E buffer, the DRAC does not require any DC bias current, unlike class A, class AB or class C. The square wave signal is the phase modulated signal from an all digital PLL (ADPLL). The N NMOS transistors 54 are operative as on/off switches. An RF choke 60 functions as a bi-directional current source, connecting the NMOS switches to the on-chip supply voltage regulator ($V_{DD}$). The switch array is driven by a digital signal. The buffer draws current from an external matching network shown. In this manner, the buffer generates an analog voltage waveform at its output.

Capacitor $C_P$ represents the on-chip capacitor connected in parallel to the drain terminals of each NMOS switch and includes, for analysis purposes, the equivalent capacitance over one cycle given by the non-linear $C_{DD}$ of the NMOS switch. The residual second harmonic of the transmit frequency is filtered by an LC series combination (not shown), allowing the DRAC itself to remain a single-ended circuit. The remaining matching network components are selected to achieve the condition where the switch output is critically damped, such that the drain voltage is low when the output current is high and vice versa.

Furthermore, in order to preserve the gate oxide integrity of the switches 54, the voltage swing at the drain must be controlled by the matching network to satisfy $V_{eff,GOI} < 2 \cdot V_{DD}$, where $V_{eff,GOI}$ represents the equivalent DC voltage on the drain resulting from one RF cycle. This buffer circuit is ideally suited to a low voltage environment in a digital CMOS process because, unlike in class A, B and C amplifiers where the transistor acts as a current source, there is no headroom requirement on $V_{DS}$ with this structure. The only requirement is that $V_{GS}$ must be able to go higher than the threshold voltage for the transistor to turn on, which is naturally guaranteed by the input digital signal. Another advantage of this buffer circuit, implemented in a deep submicron CMOS process, is that the extra input circuitry and output filtering circuitry of class F type amplifiers is not required.

The control logic for each NMOS switch comprises a pass-gate type AND gate whose inputs are the phase modulated output of the ADPLL and the amplitude control word (ACW) from a digital control block that comprises a $3^{rd}$ order sigma-delta modulator 50. In a preferred embodiment, the AND gates are implemented as a pass-gate rather than a conventional standard fully static AND gate. This has the advantage of minimizing thermal noise from the AND function which in turn reduces the ultimate broadband phase noise floor of the DRAC. As described supra, alternative implementations of the AND gate function include using a cascode (or current steering topology) or degenerative device together with the driver transistor. These approaches, however, suffer from degraded output noise performance and increased local oscillator (LO) feed through (via device parasitic capacitance) which limits the dynamic range of the DRAC, and are thus not preferred.

In the example implementation, the RF output signal generated by the DRAC circuit is subsequently input to an external power amplifier (PA) (not shown) where the signal is amplified to the appropriate levels in accordance with the particular wireless standard. The output of the power amplifier is input to an antenna (not shown) for broadcast transmission over the air. The DRAC can also be implemented with a high output-power level.

In accordance with the present invention, power control is accomplished in the DRAC by recognizing the impairments that a pseudo class E transmit buffer suffers when implemented in a CMOS process. Firstly, the NMOS switches 54 have significant on resistance and can thus only draw a limited current from the RF choke when the input waveform is high. Secondly, the rise and fall times of the input digital waveform are not negligible although they are typically less than 100 ps, depending on the CMOS process. It is the significant on resistance of the switch that is exploited in the DRAC circuit to introduce power control of the transmitted waveform and permits a fully digital method of controlling the output power. Note that by reducing the effective switch size and increasing the effective 'on' impedance, the output power of the DRAC is reduced. The effective switch size is controlled by using an array of parallel NMOS devices 54. Thus, by using a portion of the array, arbitrary output power levels below the maximum output power can be achieved.

A DRAC circuit suitable for use with the present invention is described in more detail in U.S. application Ser. No. 11/115,815, filed Apr. 26, 2005, entitled "Low Noise High Isolation Transmit Buffer Gain Control Mechanism".

As described supra, the sigma-delta modulator is used to increase the resolution of the DRAC.

The sigma-delta modulator amplitude modulates a carrier frequency signal around 1 GHz in this example embodiment. The clock signal (referred to as CKV) resembles the carrier with a frequency that is reflected by the period of the clock. The sigma-delta modulator generates an output code word that is applied to the bank of AND gates. In this example, the sigma-delta modulator is a $3^{rd}$ order modulator and is operative to generate seven outputs, labeled OUT1 through OUT7. The bank of AND gates are operative to AND the outputs of the sigma-delta modulator with the CKV clock signal. Thus, the output code determines which of the transistors are turned on for that particular CKV clock cycle. The output of each AND gate drives a transistor whose outputs are summed to yield the amplitude modulated RF output signal.

Depending on the output code generated by the sigma-delta modulator, the AND gate will either pass or block CKV clock pulses. The CKV clock pulses that pass through the AND gates turn on their respective transistors. The more transistors that are turned on, the higher the output power generated. Thus, the turning the AND gates on and off reflects the amplitude modulation information output by the sigma-delta modulator.

Figure 3:
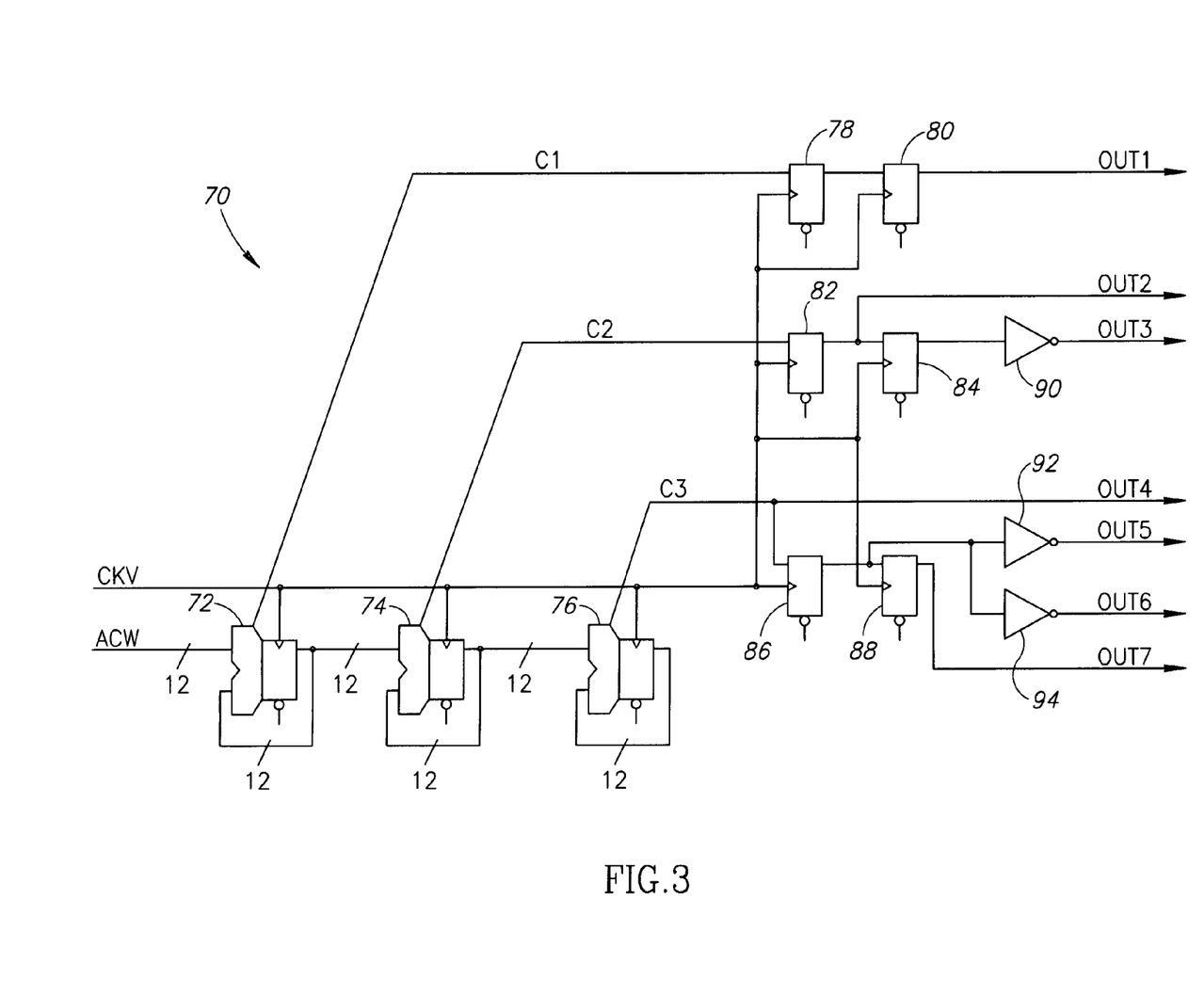
FIG. 3 is a circuit diagram illustrating the $3^{rd}$ order sigma-delta modulator of FIG. 1 in more detail.

At high sampling frequencies (i.e. ~1 GHz), it is preferable to use a $3^{rd}$ order sigma-delta modulator in the amplitude modulation path, in order to permit easier synthesis. A 12-bit $3^{rd}$ order MASH sigma-delta modulator is shown in FIG. 3. This sigma-delta modulator is shown to illustrate the principles of the present invention and is not intended to limit the scope of the invention. It is appreciated that sigma-delta modulators of different sizes and other orders may be used with the present invention. The sigma-delta modulator, generally referenced 70, comprises accumulators 72, 74, 76, registers 78, 80, 82, 84, 86, 88 and inverters 90, 92, 94 and is operative to generate the seven outputs, labeled OUT1 through OUT7.

The output stage of the modulator 70 can be expressed in the Z-domain as the following equation:

$$C_1*Z^{-2}+C_2*Z^{-1}-C_2*Z^{-2}+C_3-C_3*Z^{-1}-C_3*Z^{-1}+C_3*Z^{-2} \quad (1)$$

With reference to FIG. 3 and Equation 1 above, it is noted that the outputs OUT3, OUT5 and OUT6 are negative. In the digital domain, however, negative outputs are not possible as there are only '0's and '1's. Therefore, to differentiate between positive outputs and negative outputs, the negative outputs are input to inverters. The outputs of the inverters then represent the negative outputs in the digital domain. A problem with this, however, is that the output range for the sigma-delta modulator now changes from the original desired range of −3 to +4 to the undesirable range of 0 to 7. The original intended range of −3 to +4 was possible when the modulator was permitted to generate negative outputs.

The transformation of the negative outputs via the inverters creates an offset on the amplitude that distorts the final output spectrum as shown in the equations below. The equation for the desired output can be expressed as $$\text{Desired output} = A \cos(2\pi f_c t) \quad (2)$$

The desired output is obtained using negative outputs on output lines OUT3, OUT5 and OUT6. The equation for the actual output is expressed as $$\text{Actual output} = (A + 3)\cos(2\pi f_c t) \quad (3)$$
$$= A\cos(2\pi f_c t) + 3\cos(2\pi f_c t)$$

The actual output is generated as a result of using inverted outputs on output lines OUT3, OUT5 and OUT6. This results in an undesirable additional term (i.e. the second term in Equation 3) being added to the carrier signal which appears in the final output spectrum.

With reference to FIGS. 2 and 3, several examples are now presented to illustrate this problem.

Figure 4A:
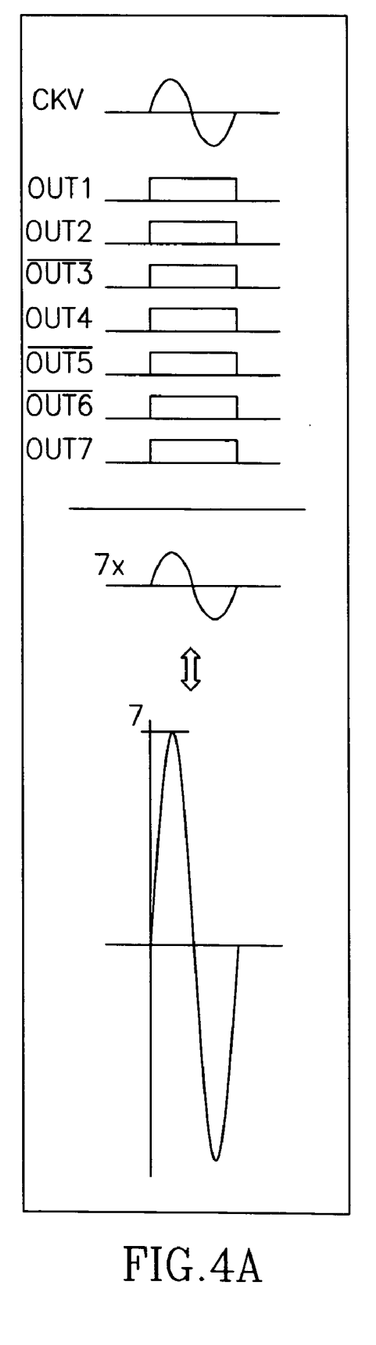
FIG. 4A is a graph illustrating the output of the DRAC when all seven output lines of the sigma-delta modulator are high and the non-inverted clock alone signal is used.

A graph illustrating the output of the DRAC when all seven output lines of the sigma-delta modulator are high and the non-inverted clock alone signal is used is shown in FIG. 4A. In this case, all seven output lines are high during the CKV pulse. Thus, the AND gates on all seven lines will pass the CKV pulse resulting in a maximum output sine wave amplitude of +7. Without the inverters in the sigma-delta modulator, the output in this case would normally be +4.

Figure 4B:
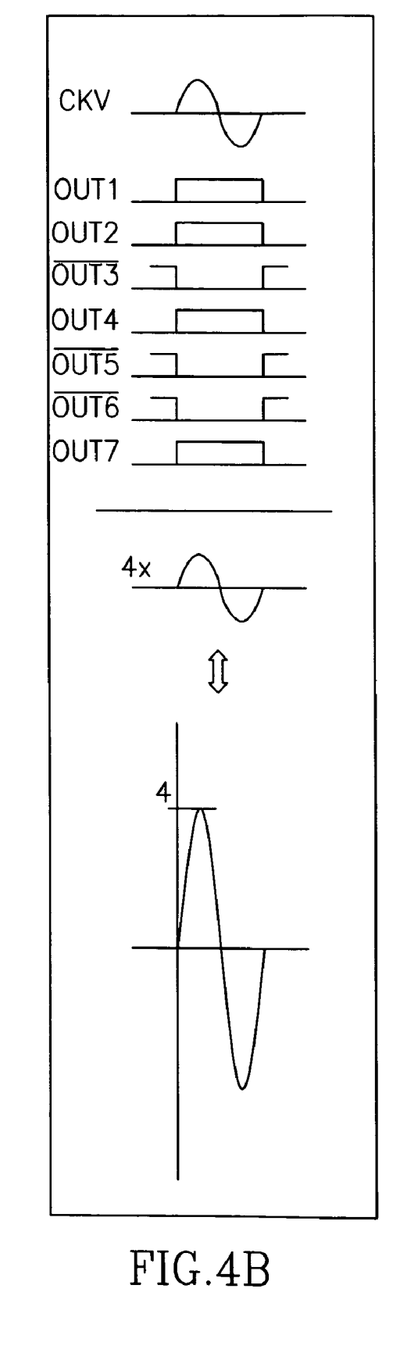
FIG. 4B is a graph illustrating the output of the DRAC when all negative outputs of the sigma-delta modulator are low and the reminder are high and the non-inverted clock signal alone is used.

A graph illustrating the output of the DRAC when all negative outputs of the sigma-delta modulator are low and the remainder are high and the non-inverted clock signal alone is used is shown in FIG. 4B. In this case, all the negative outputs after the inverters are low (i.e. OUT3, OUT5 and OUT6) and the remainder of the outputs are high. This results in an output sine wave amplitude of +4. Without the inverters in the sigma-delta modulator, the output in this case would normally be +1.

Figure 4C:
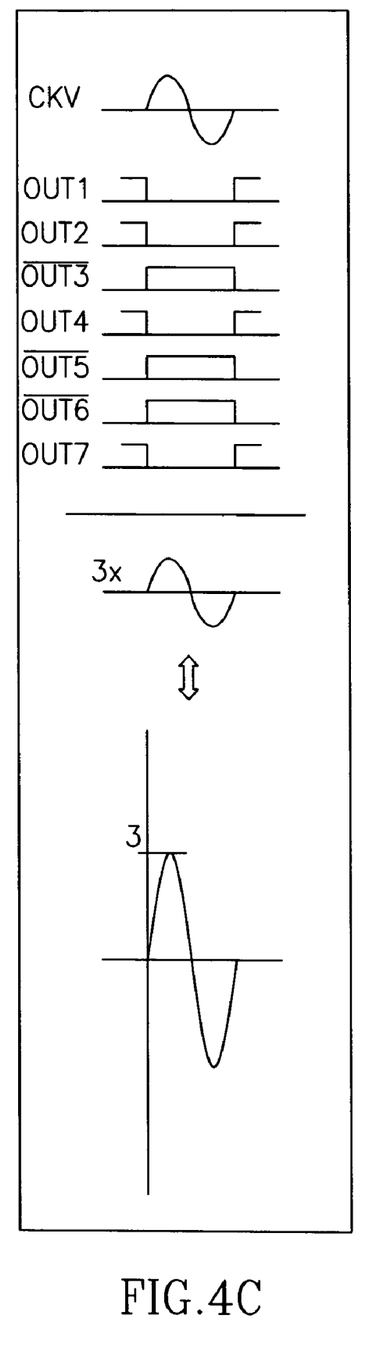
FIG. 4C is a graph illustrating the output of the DRAC when all negative outputs of the sigma-delta modulator are high and the reminder are low and the non-inverted clock signal alone is used.

A graph illustrating the output of the DRAC when all negative outputs of the sigma-delta modulator are high and the remainder are low and the non-inverted clock signal alone is used is shown in FIG. 4C. In this case, all the negative outputs after the inverters are high and the rest of the outputs are low. This results in an output sine wave amplitude of +3. Without the inverters in the sigma-delta modulator, the output in this case would normally be 0.

Figure 4D:
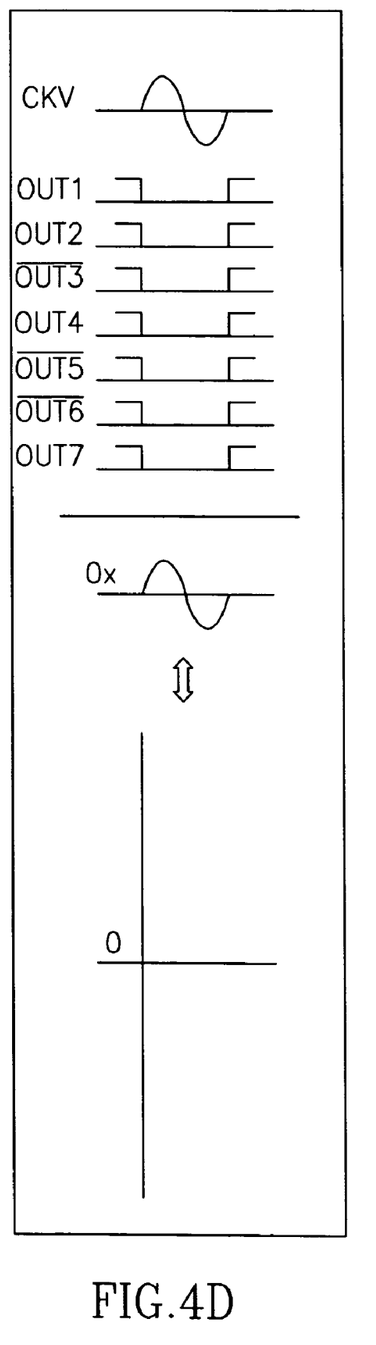
FIG. 4D is a graph illustrating the output of the DRAC when all seven output lines of the sigma-delta modulator are low and the non-inverted clock alone signal is used.

A graph illustrating the output of the DRAC when all seven output lines of the sigma-delta modulator are low and the non-inverted clock alone signal is used is shown in FIG. 4D. In this case, all the output lines are low, resulting in an output sine wave of zero amplitude. Without the inverters in the sigma-delta modulator, the output in this case would normally be −3.

The present invention provides a solution to the problem described hereinabove. In accordance with the invention, those AND gates that receive negative output lines are driven by the inverse CKV clock rather than the non-inverted CKV clock. Further, the inverters in the sigma-delta modulator are removed corresponding to the previous negative outputs. The DRAC performs a summation function of the MASH structure as well as providing a subtraction function.

Figure 5:
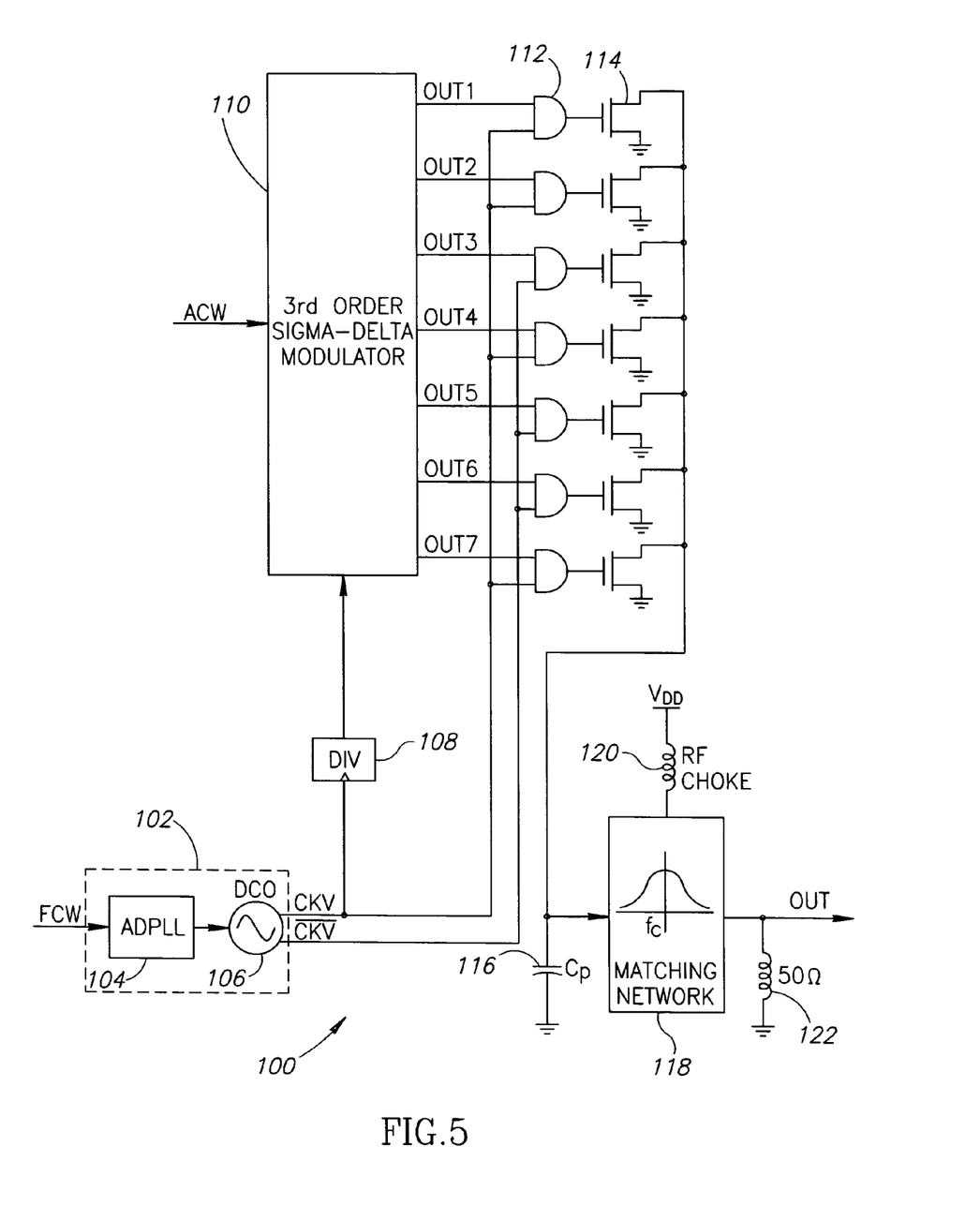
FIG. 5 is a circuit diagram illustrating an example digital to RF amplitude converter (DRAC) incorporating the negative contributive offset mechanism of the present invention.

To illustrate, consider the example DRAC described previously in connection with FIG. 2. A circuit diagram illustrating an example digital to RF amplitude converter (DRAC) incorporating the negative contributive offset mechanism of the present invention is shown in FIG. 5. The DRAC, generally referenced 100, comprises a plurality of N pass-gate type AND gates 112, a plurality of N output devices 114 (NMOS devices in this example), capacitor $C_P$ 116, matching network 118, RF choke 120 and output impedance 122. The ADPLL digital logic 104 and DCO 106 operate as in FIG. 2 with the difference being that the DCO is adapted to generate both CKV and inverse CKV clocks.

In this example, the inverters in the sigma-delta modulator corresponding to output lines OUT3, OUT5 and OUT6 are removed and the inverted CKV clock is input to the AND gates corresponding to output lines OUT3, OUT5 and OUT6 rather than the non-inverted CKV clock. The non-inverted CKV clock is input to AND gates corresponding to output lines OUT1, OUT2, OUT4 and OUT7 as before.

Figure 6A:
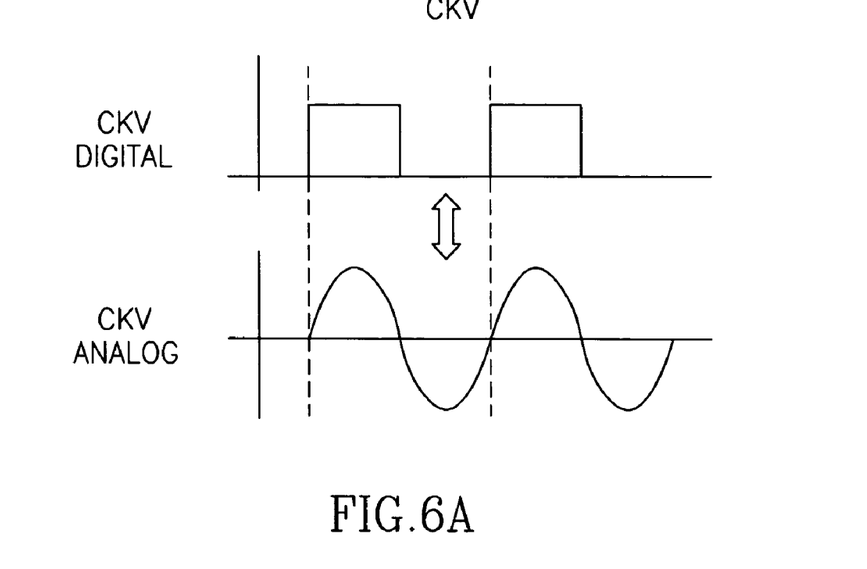
FIG. 6A is a graph illustrating the digital to analog transformation of the non-inverted clock signal.
Figure 6B:
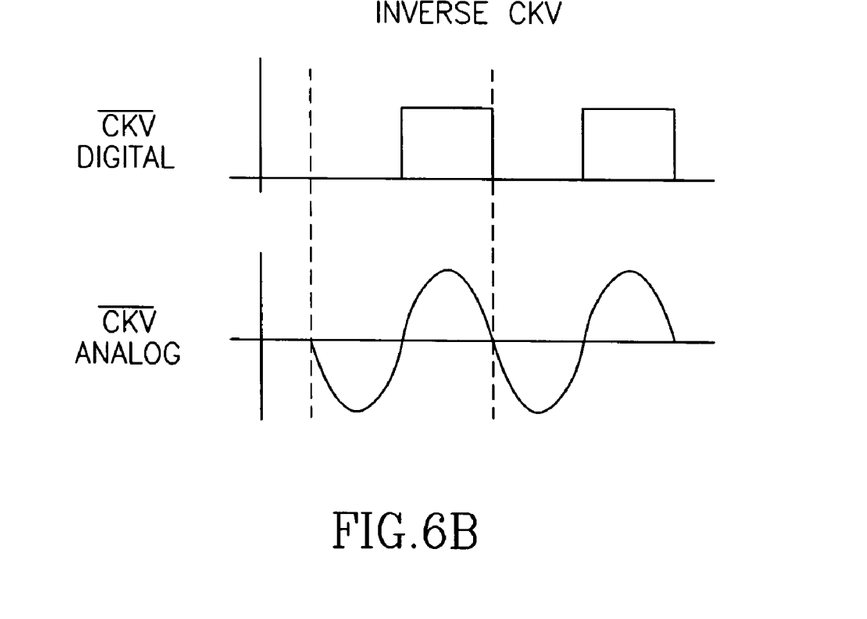
FIG. 6B is a graph illustrating the digital to analog transformation of the inverse clock signal.

This solution is effective when considering that the CKV pulse is equivalent to a sine wave cycle as shown in FIGS. 6A and 6B wherein FIG. 6A is a graph illustrating the digital to analog transformation of the non-inverted clock signal and FIG. 6B is a graph illustrating the digital to analog transformation of the inverse clock signal. The transistors receiving the CKV clock will be on during the first half of the cycle (FIG. 6A) whereas the transistors receiving the inverted CKV clock signal will be off during the first half of the cycle (FIG. 6B). Thus, the 'negative output' transistors will be off while the other transistors are on. Considering that the CKV clock is transformed in the DRAC to a sine wave, each of the transistors will result in a sine wave. When summed, the result is a sine wave having an amplitude proportional to the amplitude code word. The transistors corresponding to the three negative outputs (i.e. OUT3, OUT5 and OUT6) function to generate inverted sine waves since their corresponding AND gates are clocked with the inverse CKV. Adding the three inverted sign waves to the sign waves produced by the other transistors, effectively subtracts the sine waves from the sum. In other words, adding the sine waves on the opposite half cycle effectively performs subtraction of the sine waves which yields the desired offset compensation. Thus, a negative contributive offset is used to compensate the undesirable positive offset generated by the sigma-delta modulator.

Figure 7A:
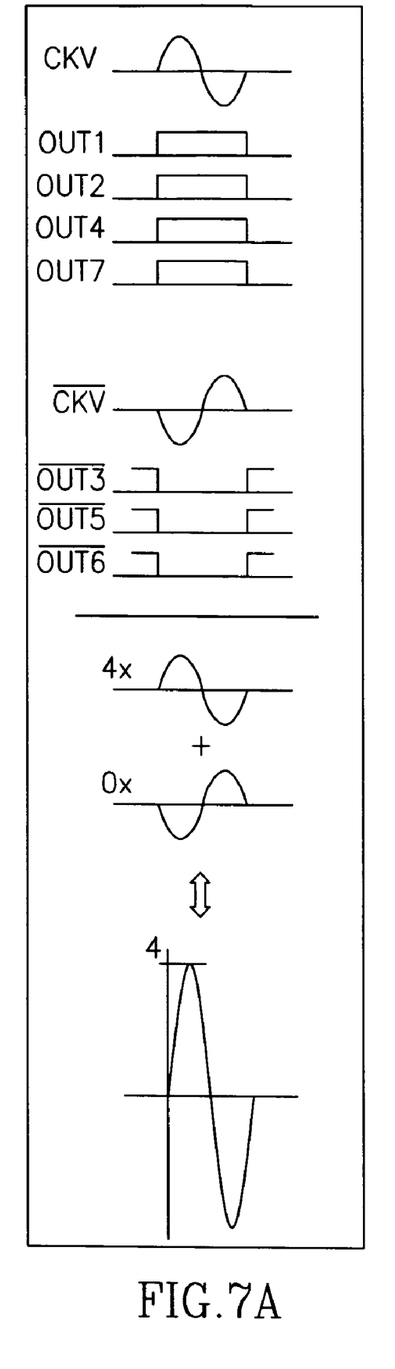
FIG. 7A is a graph illustrating the output of the DRAC incorporating the negative contributive offset mechanism of the present invention when all seven output lines of the sigma-delta modulator are high before the inverters.

With reference to FIG. 5, several examples will now be presented to illustrate the operation of the mechanism of the present invention. A graph illustrating the output of the DRAC incorporating the negative contributive offset mechanism of the present invention when all seven output lines of the sigma-delta modulator are high before the inverters (if they were present in the modulator) is shown in FIG. 7A. In this case, output lines OUT1, OUT2, OUT4 and OUT7 are high and output lines OUT3, OUT5 and OUT6 (i.e. the original 'negative outputs') are low. The three negative outputs do not contribute to the sine wave sum and the resulting output sine wave amplitude is +4, the desired result with no offset.

Figure 7B:
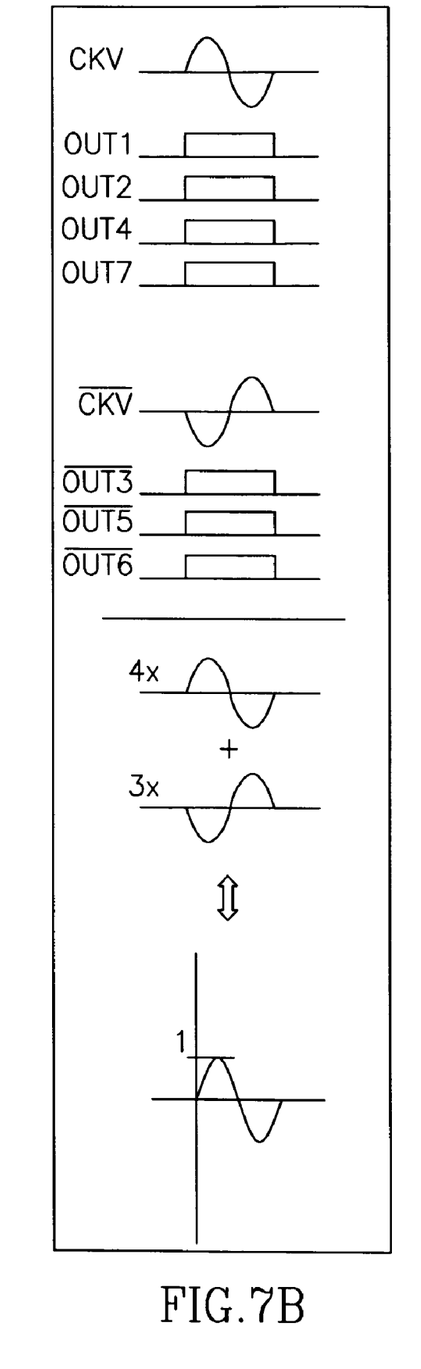
FIG. 7B is a graph illustrating the output of the DRAC incorporating the negative contributive offset mechanism of the present invention when all negative outputs of the sigma-delta modulator are low and the reminder are high before the inverters.

A graph illustrating the output of the DRAC incorporating the negative contributive offset mechanism of the present invention when all negative outputs of the sigma-delta modulator are low and the remaining outputs are high before the inverters is shown in FIG. 7B. In this case, output lines OUT1, OUT2, OUT4 and OUT7 are high and output lines OUT3, OUT5 and OUT6 (i.e. the original 'negative outputs') are also high. The three negative outputs contribute negatively to the sine wave sum since they are gated with the inverse CKV clock. The result is an output sine wave amplitude of +1, the desired result with no offset.

Figure 7C:
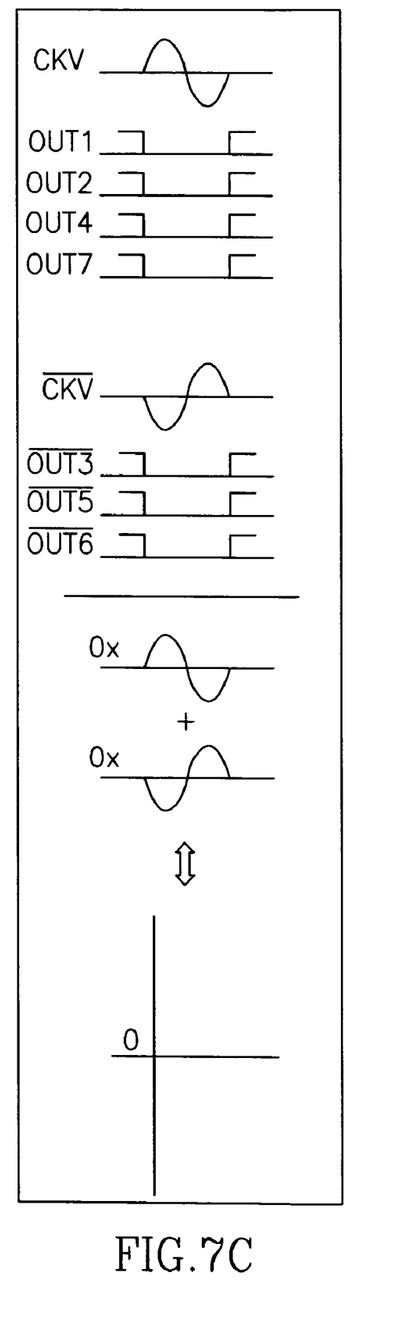
FIG. 7C is a graph illustrating the output of the DRAC incorporating the negative contributive offset mechanism of the present invention when all negative outputs of the sigma-delta modulator are high and the reminder are low before the inverters.

A graph illustrating the output of the DRAC incorporating the negative contributive offset mechanism of the present invention when all negative outputs of the sigma-delta modulator are high and the reminder are low before the inverters is shown in FIG. 7C. In this case, output lines OUT1, OUT2, OUT4 and OUT7 are low and output lines OUT3, OUT5 and OUT6 (i.e. the original 'negative outputs') are also low. The three negative outputs do not contribute to the sine wave sum and the resulting output sine wave amplitude is zero, the desired result with no offset.

Figure 7D:
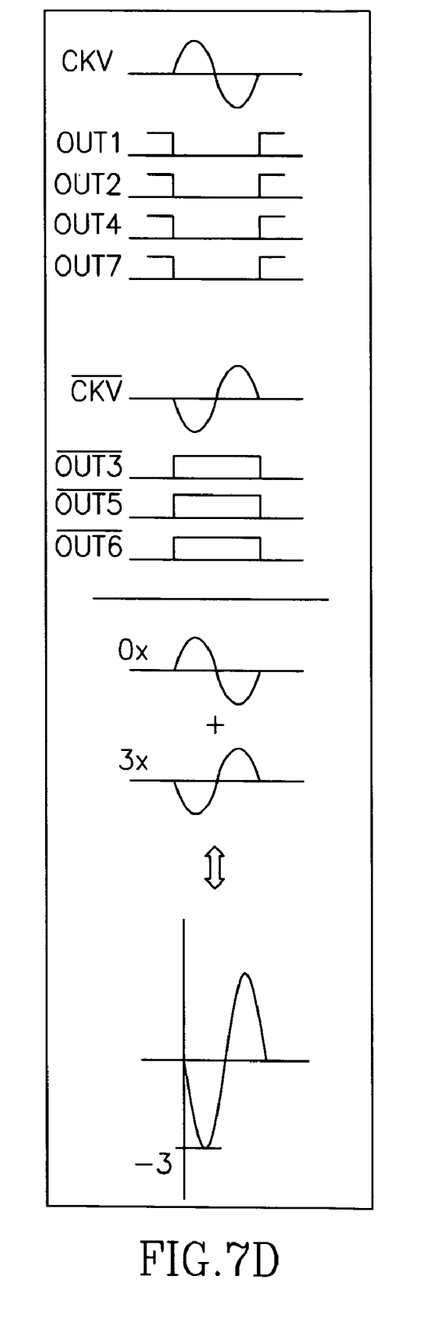
FIG. 7D is a graph illustrating the output of the DRAC incorporating the negative contributive offset mechanism of the present invention when all seven output lines of the sigma-delta modulator are low before the inverters.

A graph illustrating the output of the DRAC incorporating the negative contributive offset mechanism of the present invention when all seven output lines of the sigma-delta modulator are low before the inverters is shown in FIG. 7D. In this case, output lines OUT1, OUT2, OUT4 and OUT7 are low and output lines OUT3, OUT5 and OUT6 (i.e. the original 'negative outputs') are also high. The three negative outputs contribute negatively to the sine wave sum since they are gated with the inverse CKV clock. The result is an output sine wave phase shifted by 180 degrees, the desired result with no offset.

It is noted that the circuit of FIG. 5 could be generalized to generate a negative power contribution for circuits other than MASH sigma-delta modulation and applications other than the offset compensation. For example, the third-order sigma-delta modulator 110 of FIG. 5 could be replaced with a general circuit that converts the binary input into two unit-weighted code outputs that regulate the number of active transistor switches connected to the positive CKV and inverted CKVbar clocks. In this case, the number of switches in both sets will likely be higher than shown in FIG. 5. One of the benefits of this arrangement is the attenuation of the output leakage for low output levels when a few transistors of each set are active. In order to accurately align the CKV and CKVbar complementary contributions, it may be necessary to adjust the delay of one of these clocks in order to account for the mismatch in the delay paths.

Yet another generalization of the above arrangement could be made with the inverted CKVbar clock replaced with a constant high logic level. In this case, the transistors which are normally coupled to CKVbar, are now constantly conducting, thus attenuating the RF output amplitude. This arrangement is advantageous when addressing the need to attenuate the RF leakage level, which is particularly important in modern communication systems, such as WCDMA. This will also produce a lower output power, but this could be advantageous at lower desired amplitude levels in order to maximize the dynamic range of the output power.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of offset compensation in a digital to radio frequency (RF) amplitude converter (DRAC), said method comprising the steps of:
   coupling a plurality of transistors to positive outputs and negative outputs generated by a sigma-delta modulator;
   using a clock signal to enable a group of said transistors coupled to said positive outputs;
   using an inverted clock signal to enable a group of said transistors coupled to said negative outputs; and
   summing outputs of said transistors coupled to said positive outputs and said transistors coupled to said negative outputs to yield an offset compensated output signal.

2. The method according to claim 1, wherein said sigma-delta modulator comprises a $3^{rd}$ order sigma-delta modulator.

3. The method according to claim 1, wherein each said transistor comprises a metal oxide semiconductor (MOS) device having a gate, drain and source.

4. The method according to claim 1, wherein said clock signal is generated by a digitally controlled oscillator (DCO).

5. The method according to claim 1, further comprising the step of coupling said offset compensated output signal to a matching network.

6. The method according to claim 5, wherein said output of said matching network is coupled to an external power amplifier and antenna.

7. The method according to claim 1, adapted to be implemented in an Application Specific Integrated Circuit (ASIC).

8. The method according to claim 1, adapted to be implemented in a Field Programmable Gate Array (FPGA).

9. The method according to claim 1, wherein said inverted clock signal is an inversion of said clock signal.

10. The method according to claim 1, wherein said transistors are driving transistors.

11. A digital to radio frequency (RF) amplitude converter apparatus, comprising:

a plurality of transistors coupled to positive outputs and negative outputs generated by a sigma-delta modulator;

first means for driving transistors coupled to said positive outputs using a clock signal;

second means for driving transistors coupled to said negative outputs using an inverted version of said clock signal; and third means for summing the output of each transistor to yield an offset compensated output signal.

12. The apparatus according to claim 11, wherein said sigma-delta modulator comprises a $3^{rd}$ order sigma-delta modulator.

13. The apparatus according to claim 11, wherein each said transistor comprises a metal oxide semiconductor (MOS) device having a gate, drain and source.

14. The apparatus according to claim 11, wherein said clock signal is generated by a digitally controlled oscillator (DCO).

15. The apparatus according to claim 11, further comprising a matching network adapted to receive said offset compensated output signal.

16. The apparatus according to claim 15, further comprising an external power amplifier and antenna coupled to the output of said matching network.

17. The apparatus according to claim 11, adapted to be implemented in an Application Specific Integrated Circuit (ASIC).

18. The apparatus according to claim 11, adapted to be implemented in a Field Programmable Gate Array (FPGA).

19. A transmit buffer, comprising:

a plurality of gates arranged in a parallel array, wherein a first portion of said gates are coupled to one or more positive outputs generated by a sigma-delta modulator, a second portion of said gates are coupled to one or more negative outputs generated by said sigma-delta modulator;

first means for driving the gates coupled to said positive outputs with a clock signal;

second means for driving the gates coupled to said negative outputs with an inverted version of said clock signal;

a plurality of transistors, the output of each gate coupled to one of said transistors; and a matching network coupled to the output of each transistor and operative to generate an offset compensated radio frequency (RF) output signal.

20. The apparatus according to claim 19, wherein said plurality of gates comprises a plurality of AND gates.

21. The apparatus according to claim 19, wherein said plurality of gates comprises a plurality of pass-gate type AND gates.

22. The apparatus according to claim 19, wherein said sigma-delta modulator comprises a $3^{rd}$ order sigma-delta modulator.

23. The apparatus according to claim 19, wherein each transistor comprises a metal oxide semiconductor (MOS) device having a gate, drain and source.

24. The apparatus according to claim 19, wherein said clock signal is generated by a digitally controlled oscillator (DCO).

25. The apparatus according to claim 19, further comprising an external power amplifier and antenna coupled to the output of said matching network.

26. The apparatus according to claim 19, adapted to be implemented in an Application Specific Integrated Circuit (ASIC).

27. The apparatus according to claim 19, adapted to be implemented in a Field Programmable Gate Array (FPGA).

28. A digital to radio frequency (RF) amplitude converter apparatus, comprising:

a plurality of switches coupled to positive outputs and negative outputs generated by a digital modulator;

first means for driving a portion of said switches coupled to said positive outputs with a clock signal;

second means for driving a second portion of said switches coupled to said negative outputs with an inverted version of said clock signal; and third means for summing the output of each switch to yield an output signal.

29. A digital to radio frequency (RF) amplitude converter apparatus, comprising:

a plurality of switches coupled to positive outputs and negative outputs generated by a digital modulator;

first means for driving a first portion of said switches coupled to said positive outputs with a clock signal;

second means for driving a second portion of said switches coupled to said negative outputs with a different phase of said clock signal; and third means for summing the output of each switch to yield an output signal.

30. A method of offset compensation in a digital to radio frequency (RF) amplitude converter (DRAC), said method comprising the steps of:

coupling a plurality of transistors to positive outputs and negative outputs generated by a sigma-delta modulator;

coupling first driving transistors to said positive outputs using a clock signal;

coupling second driving transistors to said negative outputs using a different phase of said clock signal; and summing outputs of said plurality of transistors to yield an offset compensated output signal.

31. A method of offset compensation in a digital to radio frequency (RF) amplitude converter (DRAC), said method comprising the steps of:

coupling respective ones of a first plurality of transistors to respective positive outputs of a modulator;

coupling respective ones of a second plurality of transistors to respective negative outputs of said modulator;

a first clock signal enabling said first plurality of transistors;

a second clock signal enabling said second plurality of transistors; and summing outputs of said first plurality of transistors and second plurality of transistors to yield an offset compensated output signal.

32. A transmit buffer, comprising:

a plurality of gates arranged in a parallel array, wherein a first portion of said gates are coupled to one or more positive outputs generated by a sigma-delta modulator, a second portion of said gates are coupled to one or more negative outputs generated by said sigma-delta modulator;

circuitry for driving the gates coupled to said positive outputs with a first clock signal;

circuitry for driving the gates coupled to said negative outputs with a second clock signal;

a plurality of transistors, an output of each gate coupled to one of said transistors; and a matching network coupled to the output of each transistor and operative to generate an offset compensated radio frequency (RF) output signal.

33. The transmit buffer of claim 32, wherein said second clock signal is an inversion of said first clock signal.

34. A digital to radio frequency (RF) amplitude converter apparatus, comprising:
 a plurality of switches coupled to positive and negative outputs generated by a digital modulator;
 circuitry for driving a first portion of said switches coupled to said positive outputs with a first clock signal;
 circuitry for driving a second portion of said switches coupled to said positive outputs with a first clock signal;
 a plurality of transistors, an output of each gate coupled to one said transistors; and
 circuitry for summing the output of each switch to yield an output signal.

35. The digital to radio frequency (RF) amplitude converter apparatus of claim 34, wherein said second clock signal is an inversion of said first clock signal.

* * * * *